(12) United States Patent
Oh et al.

(10) Patent No.: US 7,507,485 B2
(45) Date of Patent: Mar. 24, 2009

(54) ORGANIC ELECTROLUMINESCENT DEVICE

(75) Inventors: Hyoung Yun Oh, Seoul (KR); Sung Koo Lee, Kyonggi-do (KR); Chun Gun Park, Seoul (KR); Jeong Dae Seo, Kyonggi-do (KR); Myung Seop Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 10/254,999

(22) Filed: Sep. 26, 2002

(65) Prior Publication Data

US 2003/0118866 A1 Jun. 26, 2003

(30) Foreign Application Priority Data

Oct. 30, 2001 (KR) ............... P2001-67267

(51) Int. Cl.
*H01L 51/50* (2006.01)
(52) U.S. Cl. .............. 428/690; 428/917; 313/504; 313/506
(58) Field of Classification Search ........... 428/690, 428/917; 313/506, 504; 252/301.16
See application file for complete search history.

(56) References Cited

U.S. PATENT DOCUMENTS

| 5,759,444 | A | * | 6/1998 | Enokida et al. | 252/301.16 |
| 5,935,720 | A | * | 8/1999 | Chen et al. | 428/690 |
| 6,013,383 | A | * | 1/2000 | Shi et al. | 428/690 |
| 6,614,175 | B2 | * | 9/2003 | Aziz et al. | 313/504 |
| 6,614,176 | B2 | * | 9/2003 | Kim et al. | 313/506 |

FOREIGN PATENT DOCUMENTS

| EP | 1265298 | * 12/2002 |
| JP | 1140357 | 6/1989 |
| JP | 1140359 | 6/1989 |
| JP | 10308281 | 11/1998 |
| JP | 11111458 | 4/1999 |
| JP | 11-135261 | 5/1999 |
| JP | 2000150161 | 5/2000 |
| JP | 2000164362 | 6/2000 |
| JP | 2000182768 | 6/2000 |
| JP | 2001-011031 | 1/2001 |
| JP | 2001155860 | 6/2001 |

OTHER PUBLICATIONS

Chen, C.H. et al., "Recent Developments in the synthesis of red dopants for Alq3 hosted electroluminescence", (200), Thin Solid Films, vol. 363, pp. 327-331.*

Toguchi, Satoru et al. "Novel red organic electroluminescence materials including perylene moiety", (2000), Synthetic Metals, vol. 111-112, pp. 57-61.*

Japanese Office Action dated Nov. 28, 2006.
Japanese Office Action dated Aug. 25, 2005.

* cited by examiner

*Primary Examiner*—Dawn Garrett
(74) *Attorney, Agent, or Firm*—Holland & Knight LLP

(57) ABSTRACT

Disclosed is an organic electroluminescent device including a first electrode, a second electrode, and a light-emitting layer having a guest material of a red luminescent material and at least two host materials so as to be formed between the first and second electrodes. One of the host materials is a composite including the following structural formula:

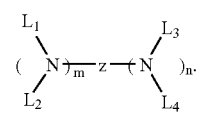

Moreover, one of the host materials can be a substituted or non-substituted quinoline derivative.

4 Claims, 2 Drawing Sheets

NPB

Copper(II) phthalocyanine(Cupc)

ORGANIC ELECTROLUMINESCENT DEVICE

This application claims the benefit of the Korean Application No. P2001-67267 filed on Oct. 30, 2001, which is hereby incorporated by reference.

BACKGROUND OF THE INVENTION

1. Field of the Invention

The present invention relates to an organic electroluminescent device, and more particularly, to an organic electroluminescent device having a red luminescent layer of which luminescent efficiency is greatly improved.

2. Discussion of the Related Art

Lately, demands for flat panel displays occupying less space are increased in accordance with the trend of increasing a screen size of a display device. One of the flat panel displays is called an organic light emitting diode (OLED) or an organic electroluminescent display. And, technology for the organic electroluminescent display is developed rapidly, whereby various prototypes have been in market already.

The organic electroluminescent device emits light in a manner that electric charges are injected in an organic layer formed between a hole injection electrode (anode) and an electron injection electrode (cathode) so as to form a pair of electron and hole to generate an exciton and an excited state of the exciton falls to a ground state so as to emit light.

The organic electroluminescent device has excellent characteristics of wide viewing angle, fast response, high contrast, and the like, thereby being applicable to a pixel of a graphic display, a television video display, a pixel of a surface light source, and the like. Moreover, the organic electroluminescent device can be formed on a flexible transparent substrate such as a plastic substrate and made to be thin and light as well as shows an excellent color tone. Hence, such an organic electroluminescent device is suitable for the next generation flat panel display (FPD).

Moreover, the organic electroluminescent device enables to express three colors including green, blue, and red, needs no backlight of a well-known liquid crystal display (LCD) so as to show less power consumption, and has the excellent color tone. Therefore, many concerns are focused on the organic electroluminescent device as the next generation full color display.

A process of fabricating a conventional organic electroluminescent device is explained in brief as follows.

(1) First of all, an anode is formed on a transparent substrate. In this case, ITO (indium tin oxide) is used as an anode material.

(2) A hole infection layer (HIL) is formed on the anode. CuPC (copper phthaiocyanine) is mainly used as the hole injection layer formed 10~30 nm thick.

(3) A hole transport layer (HTL) is formed. The hole transport layer is formed of NPB{4,4'-bis[N-(1-naphthyl) -N-phenylamino] -biphenyl} so as to be 30~60 nm thick.

(4) An organic light-emitting layer is formed on the hole transport layer. In this case, a dopant is added thereto if necessary. For instance, in case of green luminescence, $Alq_3${tris(8-hydroxy-quinolate)aluminum} is used as the organic light-emitting layer so as to be formed 30~60 nm thick. And, MQD (N-methylquinacridone) is used as the dopant.

(5) An electron transport layer (ETL) and an electron infection layer (EIL) are formed successively on the organic light-emitting layer, or an electron injection transport layer is formed thereon.

In green luminescence, Alq3 used in the organic light-emitting layer has an excellent capability of electron transport, whereby the electron injection/transport layer(s) may not be formed additionally.

(6) Finally, a cathode is formed, and then a passivation layer is formed.

In such a structure, each of blue, green, and red luminescent devices can be realized in accordance with how the organic light-emitting layer is formed. Yet, red luminescence of high efficiency has difficulty in being realized.

Generally, CuPC having excellent hole injection capability and thermal stability is used as a hole injection layer in OELD (organic electroluminescent display).

The thicker CuPC is formed, the more hole injection occurs. Yet, a color is shifted strongly to blue.

Hence, in luminescence of a full color OELD, red wavelength is absorbed so as to reduce an efficiency of red greatly.

If CuPC fails to be used as the hole injection layer, low Tg (glass transition temperature) of the hole transport layer brings about degradation between the anode and hole transport layer so as to decrease durability of the device.

Moreover, when CuPC is formed 10~60 Å thick, absorption of red wavelength hardly occurs but hole injection is degraded so as to reduce an efficiency of the device greatly.

SUMMARY OF THE INVENTION

Accordingly, the present invention is directed to an organic electroluminescent device that substantially obviates one or more problems due to limitations and disadvantages of the related art.

An object of the present invention is to provide an organic electroluminescent device enabling to increase a red luminescence efficiency by developing a host system transferring energy to a red luminescent material efficiently.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic electroluminescent device according to the present invention includes a first electrode, a second electrode, and a light-emitting layer having a guest material of a red luminescent material and at least two host materials so as to be formed between the first and second electrodes.

Preferably, a composition of the light-emitting layer includes 0.01~30 wt/% of the guest material and 0.05~99.9 wt/% of the host materials.

Preferably, the guest material is selected from the group consisting of a DCM derivative, a Nile red derivative, a Coumarine derivative, a Phodamine derivative, a pyrromethene derivative, and a benzothioxanphene derivative.

Preferably, one of the host materials is a composite including the following structural formula:

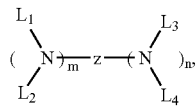

wherein (m+n) is an integer of 1 to 8;

z is $A_1$ or $-A_2-Q-A_3-$, $A_1$ is selected from the group consisting of a substituted or non-substituted aromatic hydrocarbon group, a heterocycle group, or an aliphatic hydrocarbon group wherein a bond between $A_1$ and nitrogen (N) is connected to an aliphatic hydrocarbon group or an amide or imine bond if $A_1$ is the aromatic hydrocarbon or heterocycle group, $A_2$ and $A_3$ are aromatic hydrocarbon groups or heterocycle groups substituted or non-substituted independently, respectively, a bond of $A_2$, $A_3$ and nitrogen (N) can be connected to the aromatic hydrocarbon group or the amide or imine bond, Q is a substituted or non-substituted aromatic hydrocarbon group, a heterocycle group, or an aliphatic hydrocarbon group, or an element of groups IIIB, IVB, VB, and VIB wherein a bond of $Q-A_2$, $Q-A_3$, or $Q-A_2-A_3$ is connected to the aliphatic hydrocarbon group, an element of groups IIIB, IVB, VB, and VIB, a substituted or non-substituted aliphatic hydrocarbon group, or a bond of amide, ester, carbonyl, azo, and imine if Q is a substituted or non-substituted aromatic hydrocarbon group or a heterocycle group; and $L_1$, $L_2$, $L_3$, and $L_4$ are selected from the group consisting of a substituted or non-substituted aromatic hydrocarbon group, heterocycle group, an aliphatic hydrocarbon group, a silyl group, and a hydrogen atom, respectively wherein $L_1$, $L_2$, $L_3$, and $L_4$ can be bonded to each other chemically, equal to each other, or different from each other.

Preferably, one of the host materials is a substituted or non-substituted quinoline derivative.

In another aspect of the present invention, an organic electroluminescent device includes a first electrode, a second electrode, a light-emitting layer having a guest material of a red luminescent material and at least two host materials so as to be formed between the first and second electrodes, and a hole injection/transport layer formed between the first electrode and light-emitting layer.

Preferably, a maximum PL luminescent peak is at least 550 nm and maximum PL luminescent peaks of the first and second host materials are 500~600 nm.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Figure 1A:
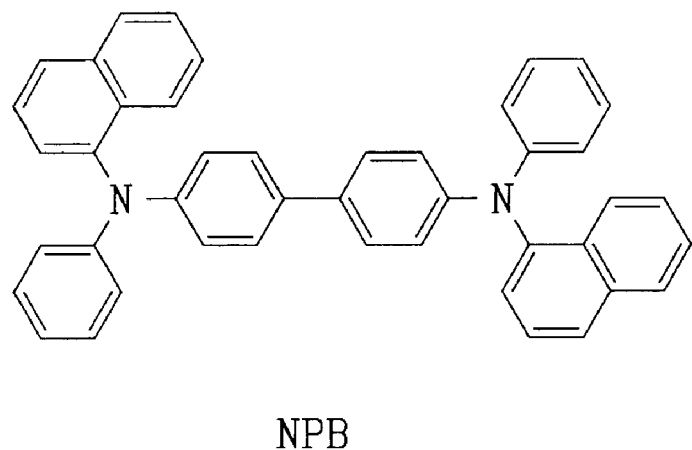
FIG. 1A and FIG. 1B illustrate structural formulas of NPB and CuPC used in the present invention, respectively.
Figure 1B:
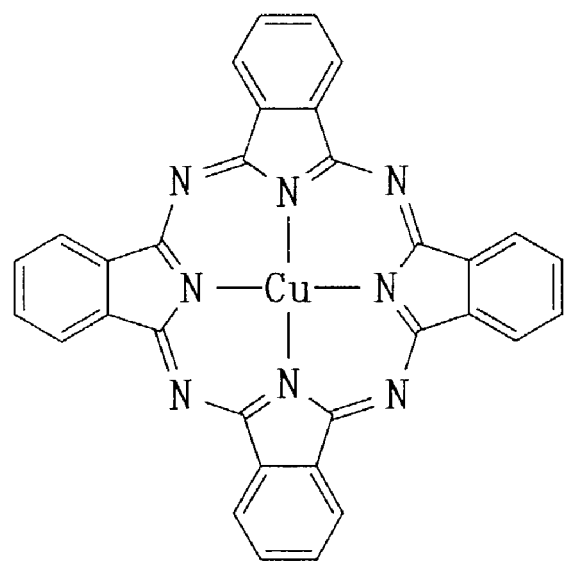

Reference will now be made in detail to the preferred embodiments of the present invention, examples of which are illustrated in the accompanying drawings. Wherever possible, the same reference numbers will be used throughout the drawings to refer to the same or like parts.

An organic electroluminescent device according to the present invention includes a first electrode, a second electrode, and a light-emitting layer consisting of a guest material of a red luminescent material and at least two host materials so as to be formed between the first and second electrodes.

In this case, a composition of the light-emitting layer includes 0.01~30 wt/% of the guest material and 0.05~99.9 wt/% of the host materials.

And, the guest material is selected from the group consisting of a DCM derivative, a Nile red derivative, a Coumarine derivative, a Phodamine derivative, a pyrromethene derivative, and a benzothioxanphene derivative.

Moreover, one of the host materials is a composite including the following structural formula.

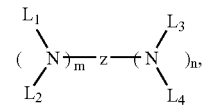

where (m+n) is an integer of 1 to 8;

z is $A_1$ or $-A_2-Q-A_3-$, $A_1$ is selected from the group consisting of a substituted or non-substituted aromatic hydrocarbon group, a heterocycle group, or an aliphatic hydrocarbon group wherein a bond between $A_1$ and nitrogen (N) is connected to an aliphatic hydrocarbon group or an amide or imine bond if $A_1$ is the aromatic hydrocarbon or heterocycle group, $A_2$ and $A_3$ are aromatic hydrocarbon groups or -heterocycle groups substituted or non-substituted independently, respectively, a bond of $A_2$, $A_3$ and nitrogen (N) can be connected to the aromatic hydrocarbon group or the amide or imine bond, Q is a substituted or non-substituted aromatic hydrocarbon group, a heterocycle group, or an aliphatic hydrocarbon group, or an element of groups IIIB, IVB, VB, and VIB wherein a bond of $Q-A_2$, $Q-A_3$, or $Q-A_2-A_3$ is connected to the aliphatic hydrocarbon group, an element of groups IIIB, IVB, VB, and VIB, a substituted or non-substituted aliphatic hydrocarbon group, or a bond of amide, ester, carbonyl, azo, and imine if Q is a substituted or non-substituted aromatic hydrocarbon group or a heterocycle group; and $L_1$, $L_2$, $L_3$, and $L_4$ are selected from the group consisting of a substituted or non-substituted aromatic hydrocarbon group, a heterocycle group, an aliphatic hydrocarbon group, a silyl group, and a hydrogen atom, respectively wherein $L_1$, $L_2$, $L_3$, and $L_4$ can be bonded to each other chemically, equal to each other, or different from each other.

Moreover, one of the host materials can be a substituted or non-substituted quinoline derivative.

An organic electroluminescent device according to another embodiment of the present invention includes a first electrode, a second electrode, a light-emitting layer consisting of a guest material of a red luminescent material and at least two host materials so as to be formed between the first and second electrodes, and a hole injection/transport layer formed between the first electrode and light-emitting layer, wherein an electron injection/transport layer can be formed between the second electrode and light-emitting layer.

In this case, a maximum PL luminescent peak is at least 550 nm and maximum PL luminescent peaks of the first and second host materials are 500~600 nm.

And, the "PL (photoluminescence) peak" is a peak of a liquid state after dissolution in a solvent of THF (tetrahydrofuran), chloroform, acetacidethyl, etc.

The light-emitting layer of the present invention has a composition of 0.01~30 wt/% of the guest, 0.05~99.9 wt/% of the first host, and 0.05~99.9 wt/% of the second host.

The first host used in the present invention is a compound having the following structural formula.

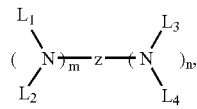

where (m+n) is an integer of 1 to 8;
z is $A_1$ or $-A_2-Q-A_3-$,
A1 is selected from the group consisting of a substituted or non-substituted aromatic hydrocarbon group, a heterocycle group, or an aliphatic hydrocarbon group wherein a bond between $A_1$ and nitrogen (N) is connected to an aliphatic hydrocarbon group or an amide or imine bond if $A_1$ is the aromatic hydrocarbon or heterocycle group,
$A_2$ and $A_3$ are aromatic hydrocarbon groups or heterocycle groups substituted or non-substituted independently, respectively, a bond of $A_2$, $A_3$ and nitrogen (N) can be connected to the aromatic hydrocarbon group or the amide or imine bond,
Q is a substituted or non-substituted aromatic hydrocarbon group, a heterocycle group, or an aliphatic hydrocarbon group, or an element of groups IIIB, IVB, VB, and VIB wherein a bond of $Q-A_2$, $Q-A_3$, or $Q-A_2-A_3$ is connected to the aliphatic hydrocarbon group, an element of groups IIIB, IVB, VB, and VIB, a substituted or non-substituted aliphatic hydrocarbon group, or a bond of amide, ester, carbonyl, azo, and imine if Q is a substituted or non-substituted aromatic hydrocarbon group or a heterocycle group; and
$L_1$, $L_2$, $L_3$, and $L_4$ are selected from the group consisting of a substituted or non-substituted aromatic hydrocarbon group, a heterocycle group, an aliphatic hydrocarbon group, a silyl group, and a hydrogen atom, respectively wherein $L_1$, $L_2$, $L_3$, and $L_4$ can be bonded to each other chemically, equal to each other, or different from each other.

Preferably, the element of the groups IIIB, IVB, VB, and VIB is selected from the group consisting of B, C, Si, N, O, S, and Se.

Each of the aliphatic hydrocarbon groups connecting the $A_1/A_2/A_3/N$, $A_2/Q$, and $A_3/Q$, respectively has 1 to 12 carbon atoms. Preferably, the aliphatic hydrocarbon group is selected from the group consisting of methylene, ethylene, trimethylene, cyclohexanedyl, adamanthanediyl, and vinylene groups.

A substituent of the $A_1$, $A_2$, $A_3$, or Q is selected from the group consisting of aryloxy, arylcarbonyl, aryloxycarbonyl, arylcarboxy, aralkyl, arylaminocarbonyl, arylcarbonylamino, arylsilyl, alkyl, alkoxy, alkoxycarbonyl, acyl, acyloxy, acylamino, alkylamino, alkylaminocarbonyl, alkylsulfanyl, alkylsilyl, carbamoyl, hydroxy, amino, cyano, nitro, and thiol groups and halogen atoms. More preferably, the substituent is selected from the group consisting of phenoxy, naphthyloxy, phenylcarbonyl, naphthyloxycarbonyl, phenylcarboxy, benzyl, styryl, vinyl, anilinocarbonyl, benzoylamino, tri-phenylsilyl, methyl, ethyl, propyl, i-propyl, t-butyl, cyclohexyl, methoxy, ethoxy, propoxy, butoxy, methoxycarbonyl, ethoxycarbonyl, formyl, propionyl, acetyloxy, propionylamino, dimethylamino, di-I-propylamino, ethylsulfanyl, and trimethylsilyl groups, F, and Cl.

Each of the $A_1$, $A_2$, $A_3$, and Q can have at least two of the substituents. In this case, at least two of the substituents are boned to each other so as to form a saturated or unsaturated ring.

The aliphatic hydrocarbon group of the $A_1$ or Q is selected from the group consisting of methylene, ethylene, cyclohexanedyl, and adamanthanediyl groups. Moreover, an aromatic hydrocarbon or heterocyclic group of each of the $A_1$, $A_2$, $A_3$, and Q is selected from the group consisting of compounds having the following structural formulas.

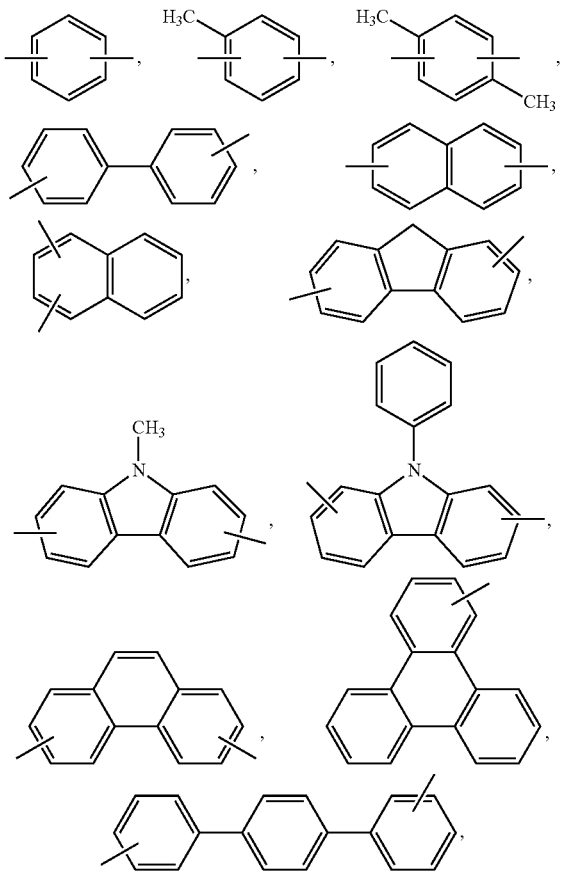

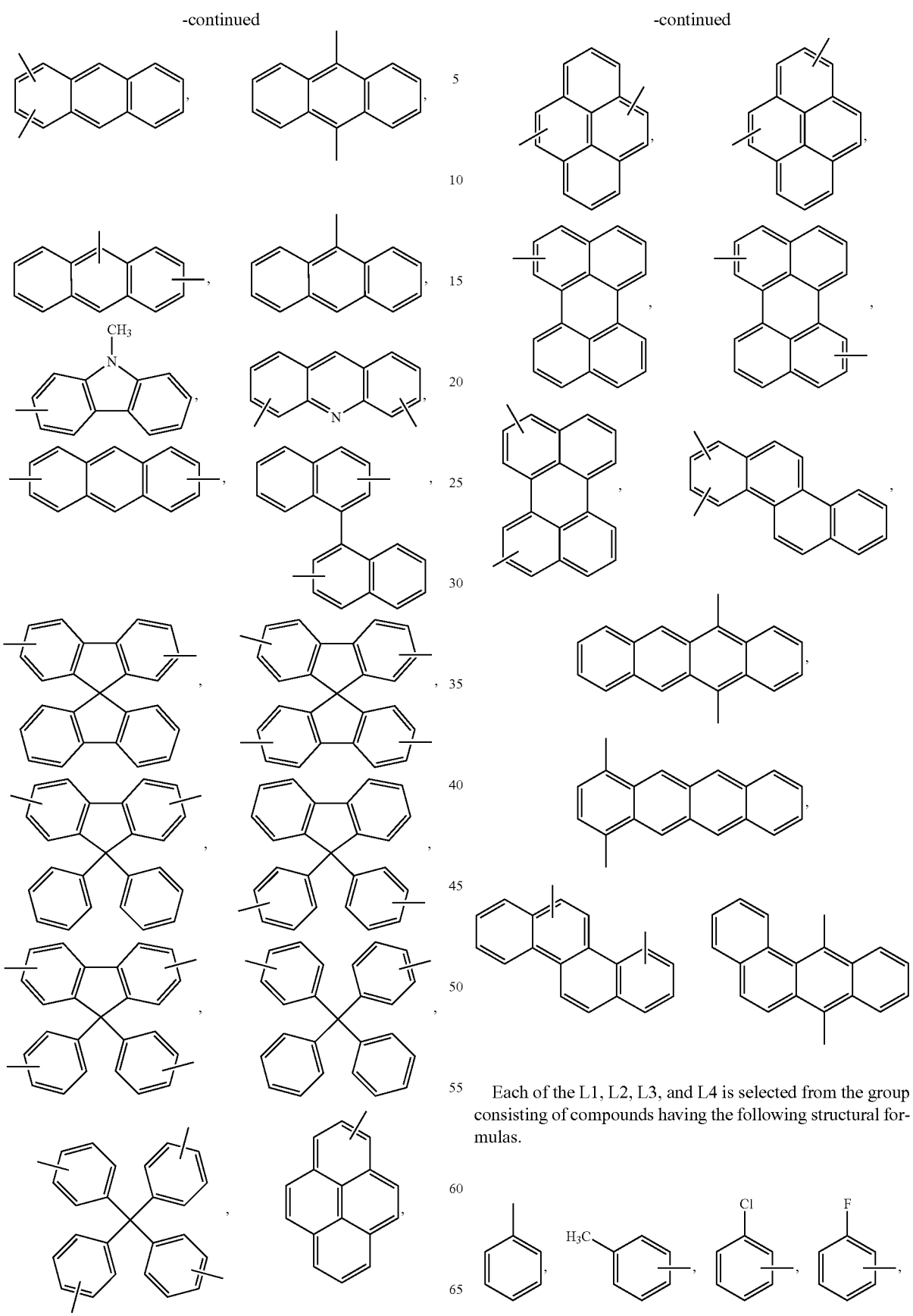
Each of the L1, L2, L3, and L4 is selected from the group consisting of compounds having the following structural formulas.

-continued

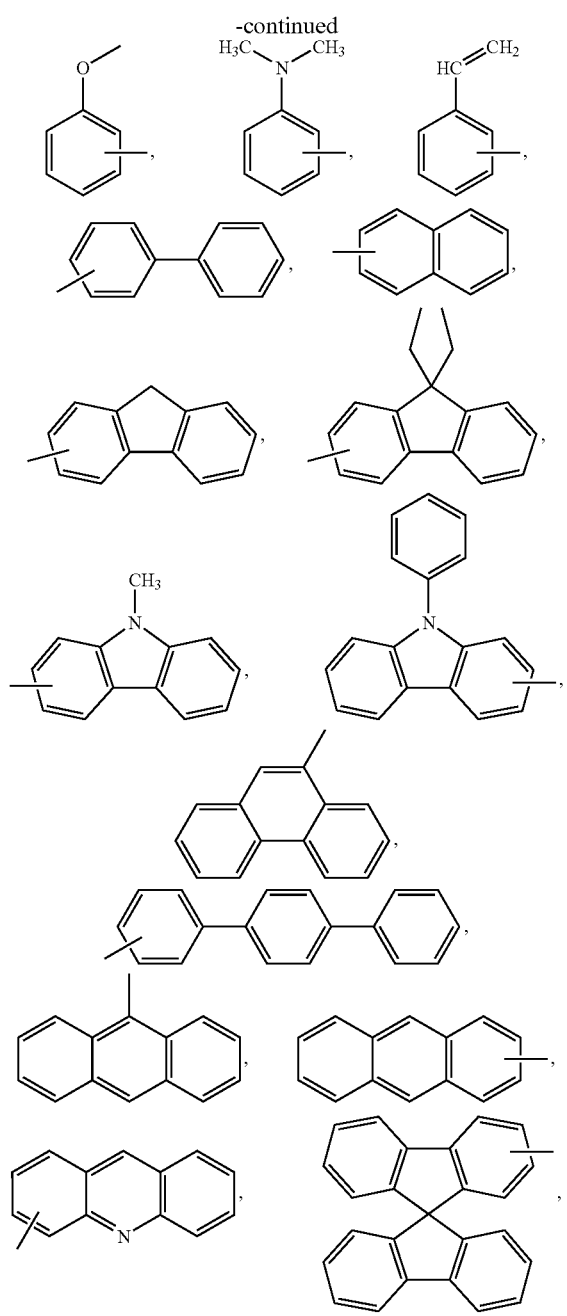

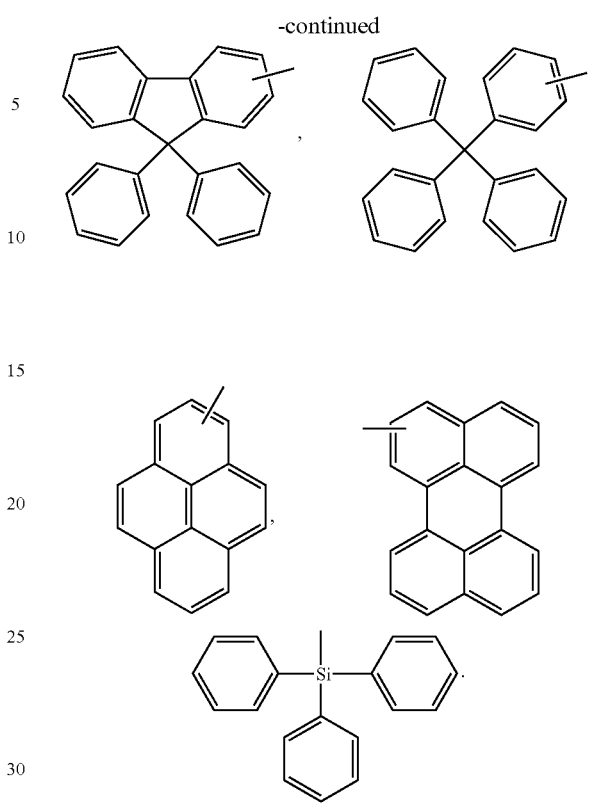

Meanwhile, each substituent of the $L_1$, $L_2$, $L_3$, and $L_4$ is selected from the group consisting of aryloxy, arylamino, alkoxy, alkyl, alkylamino, hydroxy, amino, carbonyl, amide, and carboxy groups and halogen atoms. More preferably, the substituent is selected from the group consisting of phenoxy, tolyloxy, vinyl, aldehyde, methyl, ethyl, propyl, i-propyl, t-butyl, cyclohexyl, diphenylamino, methoxy, ethoxy, propoxy, butoxy, dimethylamino, and carboxylic acid groups, F, and Cl.

The first host according to the present invention can be selected from the group consisting of the following structural compounds.

J-2

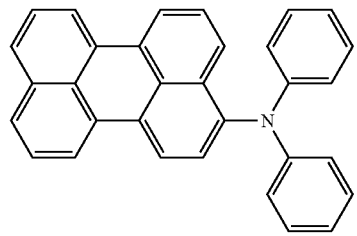

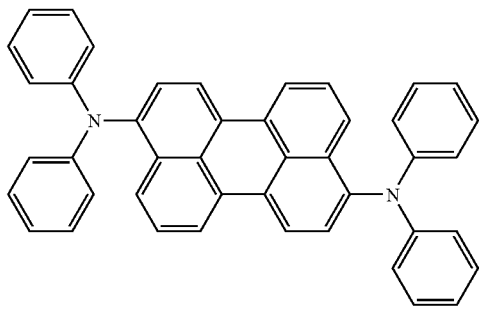

-continued
J-3
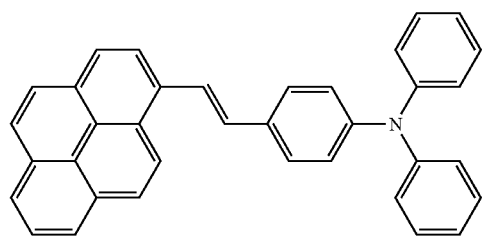
J-4
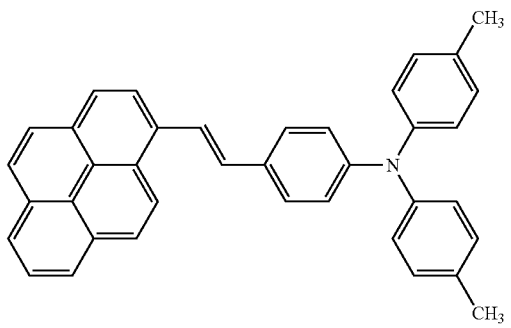
J-5
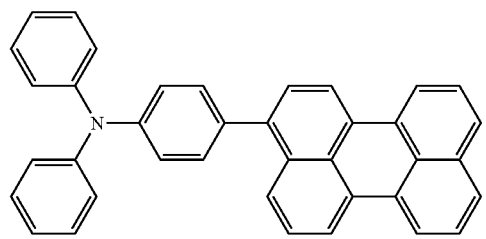
J-6
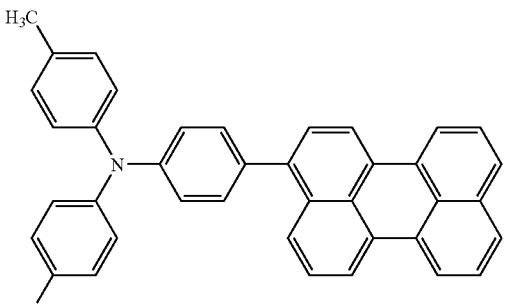
J-7
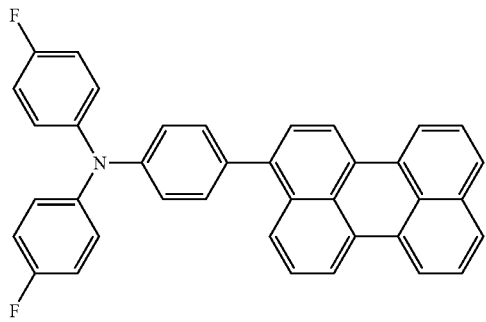
J-8
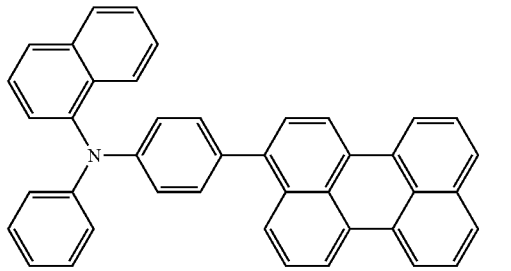
J-9
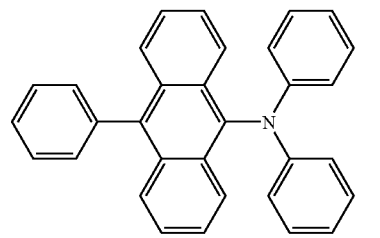
J-10
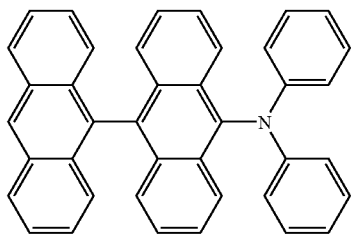
J-11
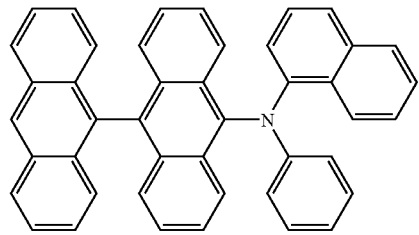
J-12
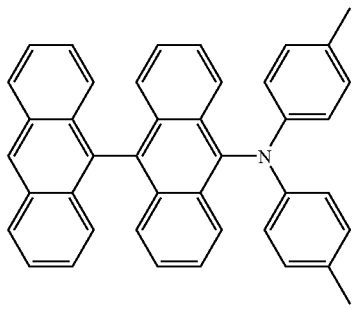

-continued
J-13
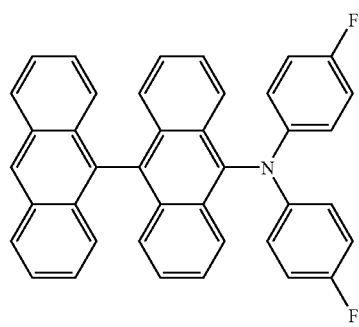
J-14
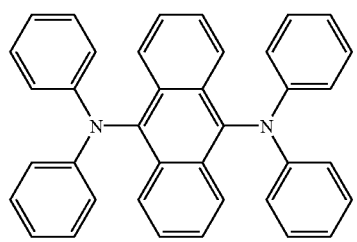
J-15
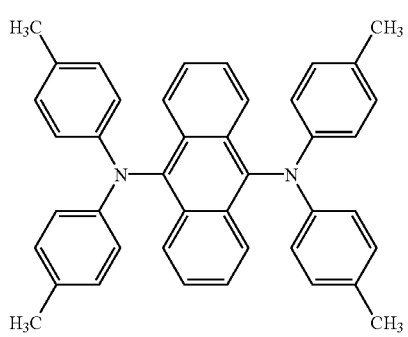
J-16
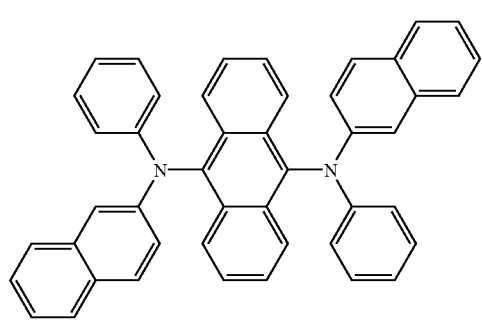
J-17
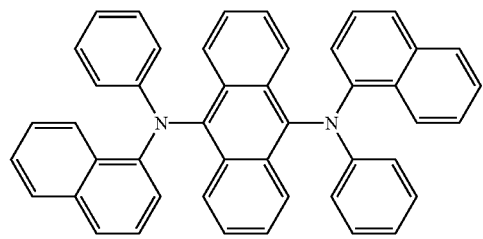
J-18
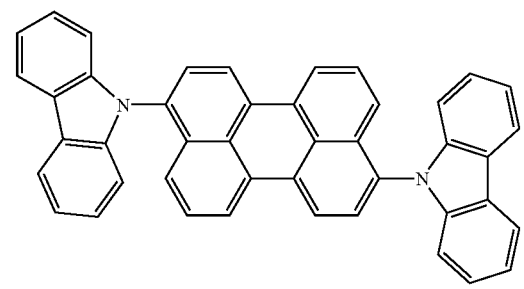
J-19
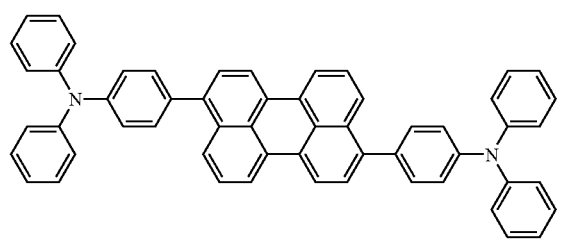
J-20
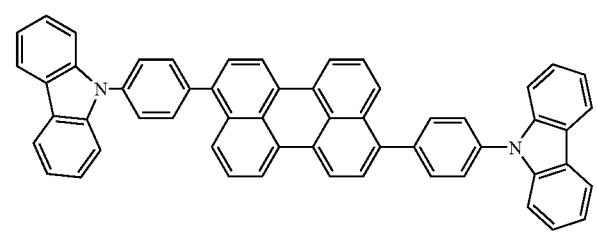
J-21
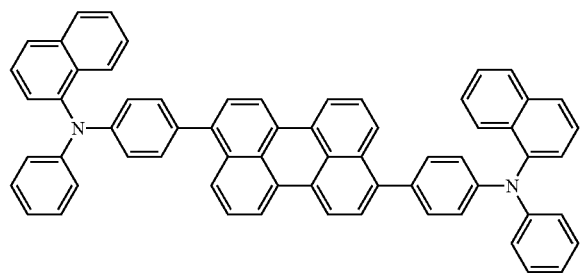
J-22
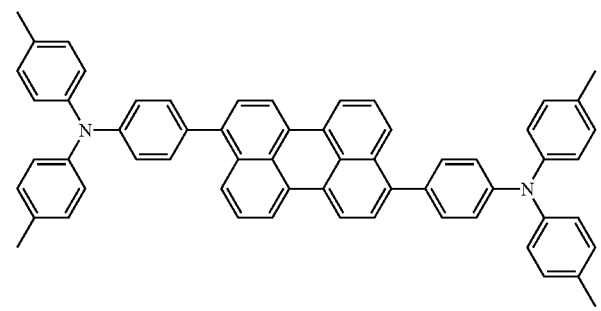

-continued
J-23
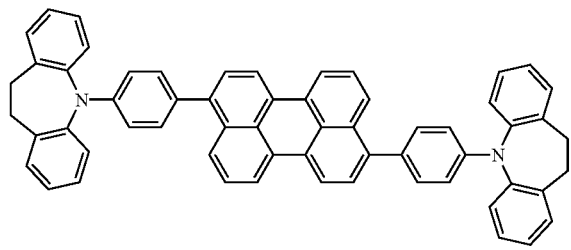
J-24
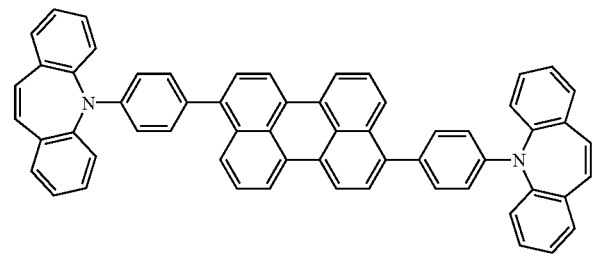
J-25
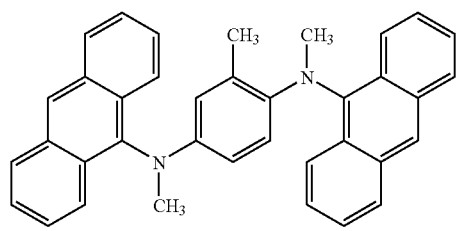
J-26
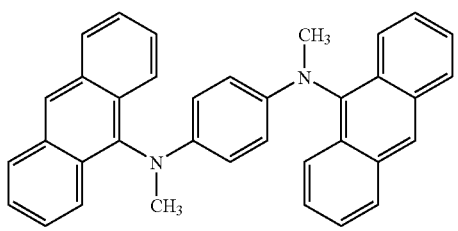
J-27
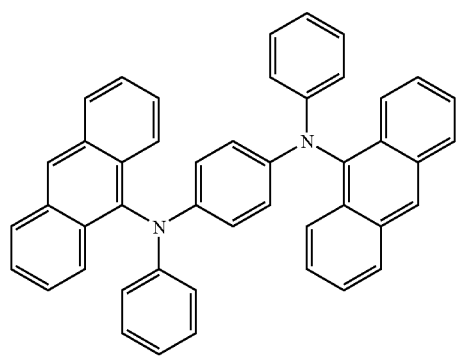
J-28
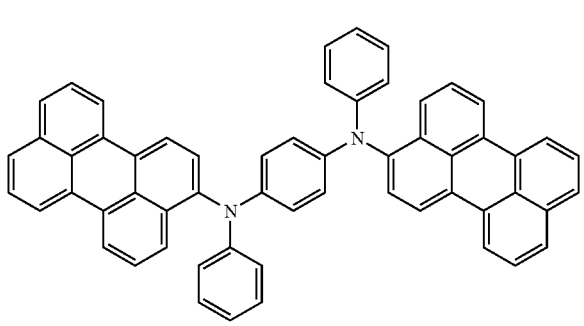
J-29
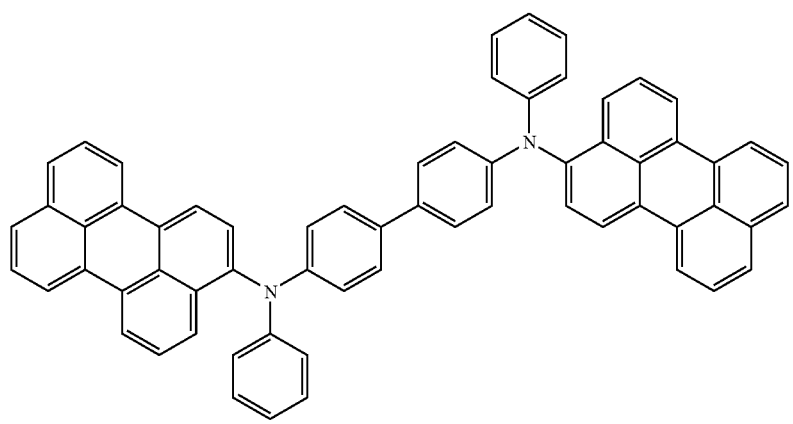

-continued
J-30
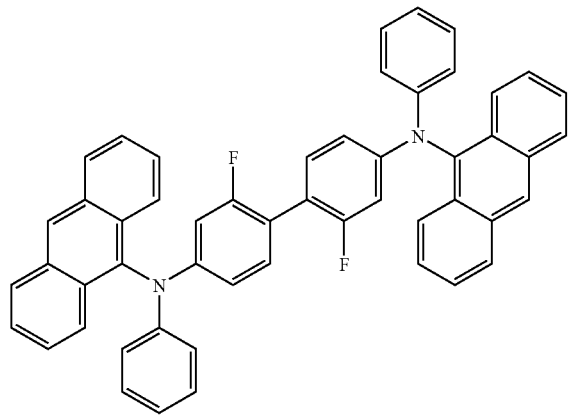
J-31
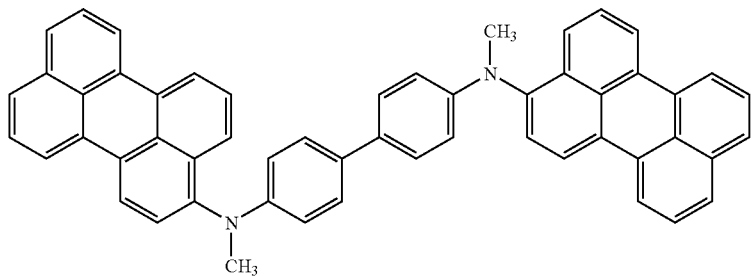
J-32        J-33
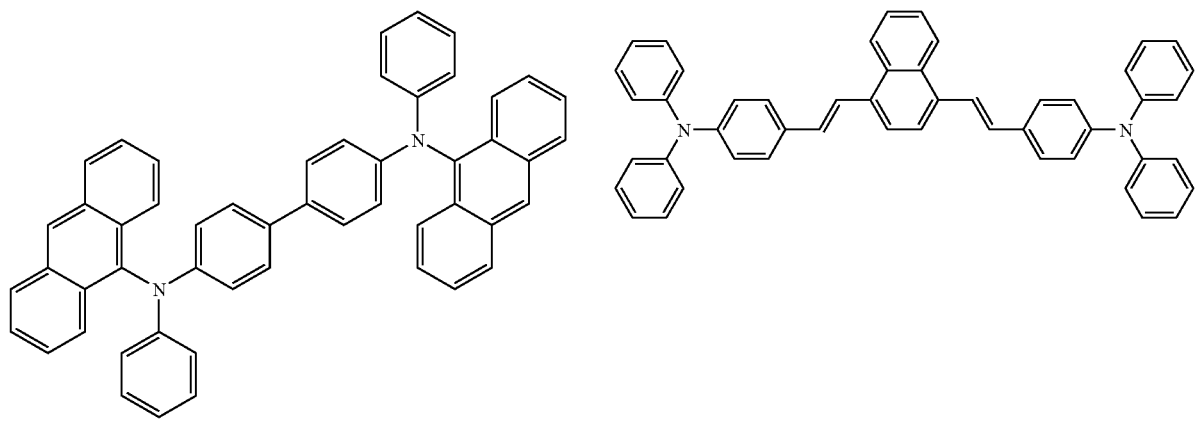
J-34
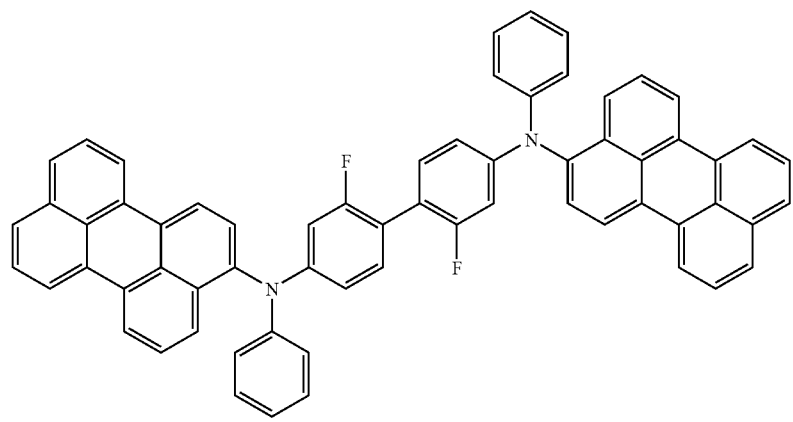

-continued
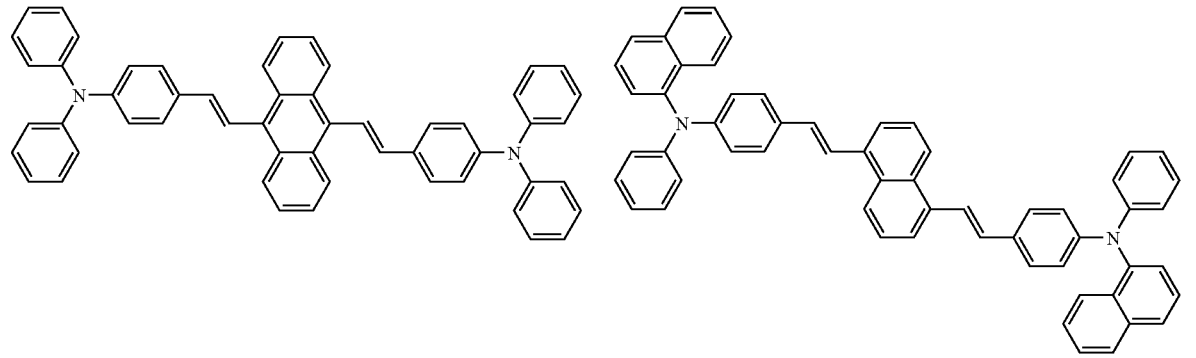
J-35
J-36
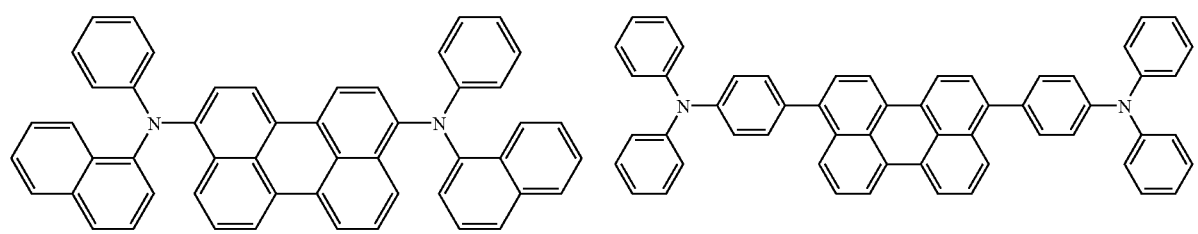
J-37
J-38
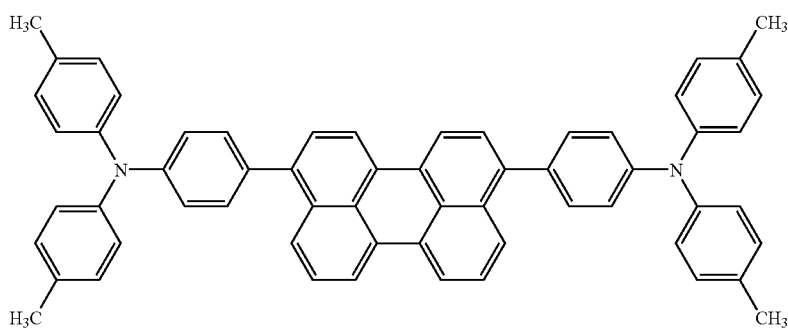
J-39
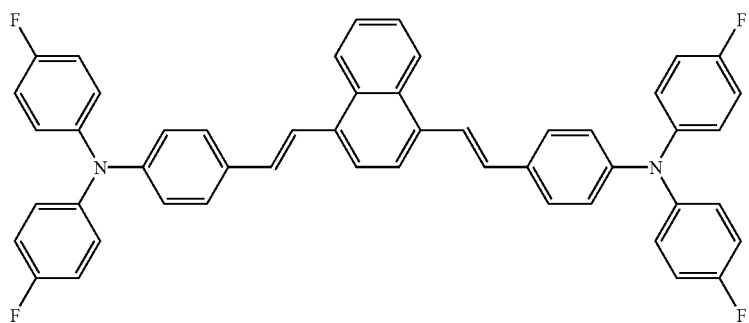
J-40
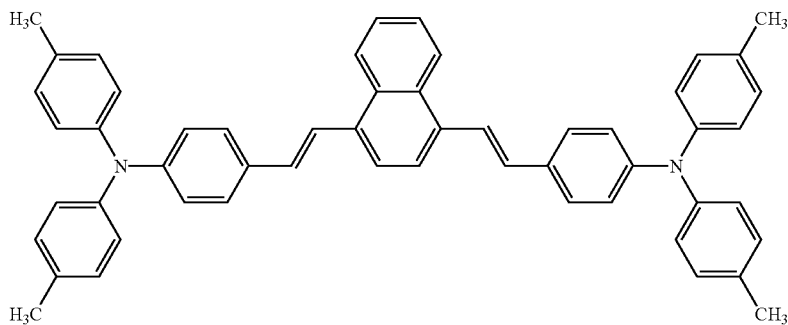
J-41

-continued
J-42
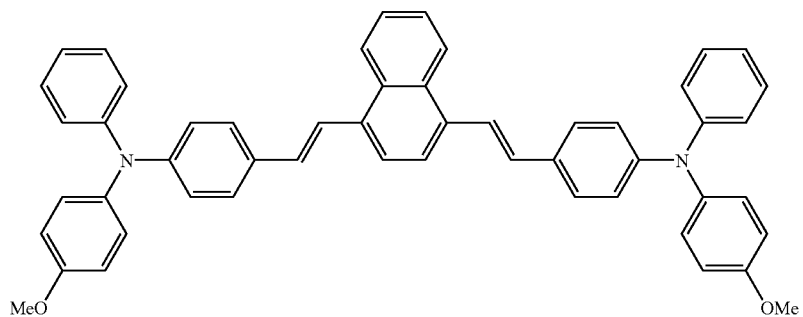
J-43
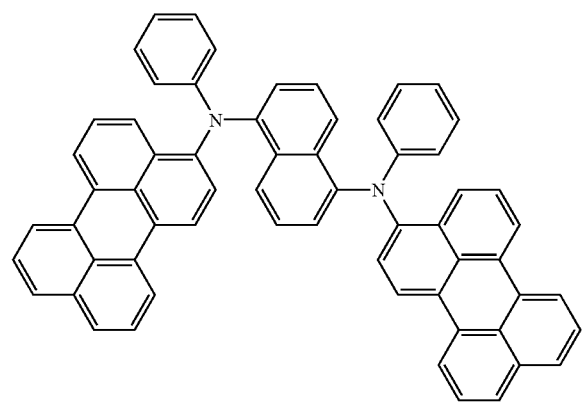
J-44
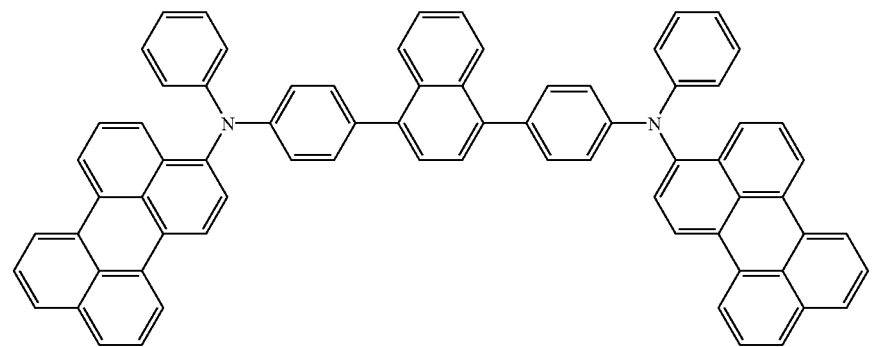
J-45 J-46
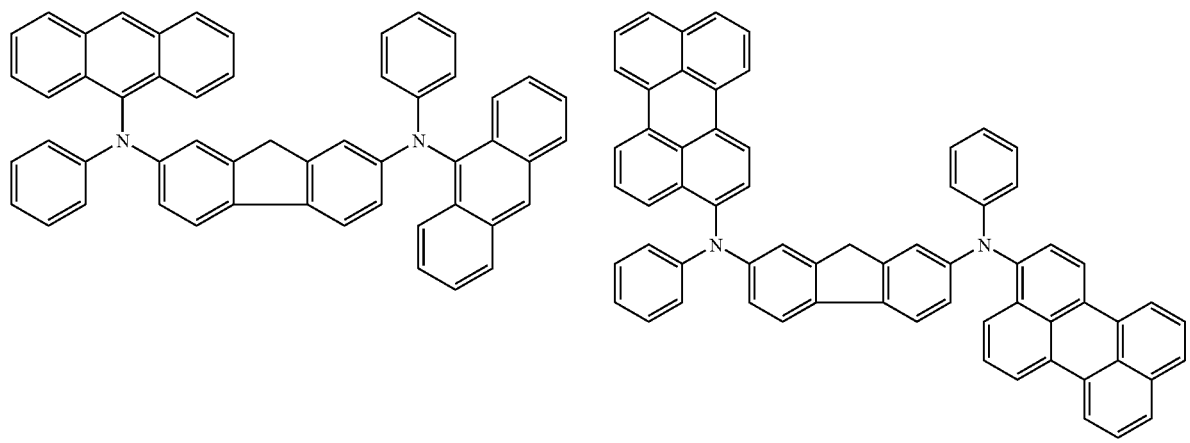

-continued
J-47
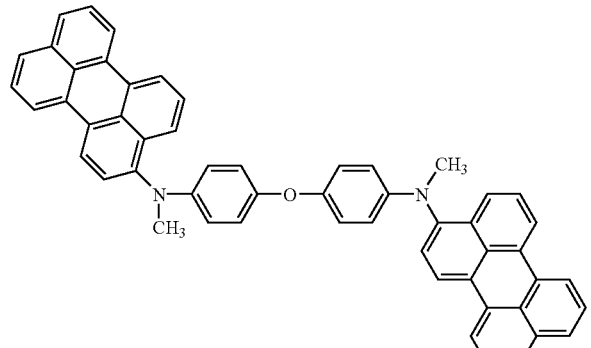
J-48
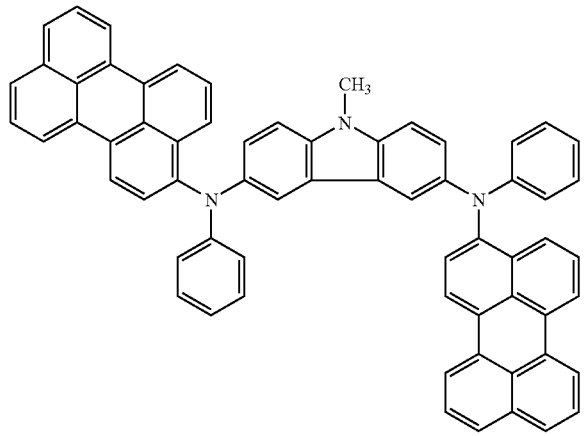
J-49
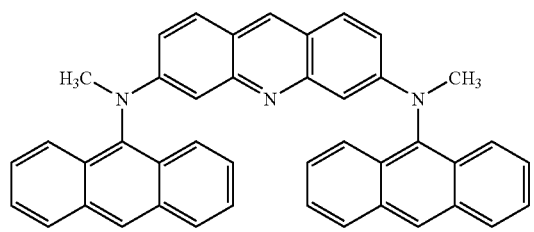
J-50
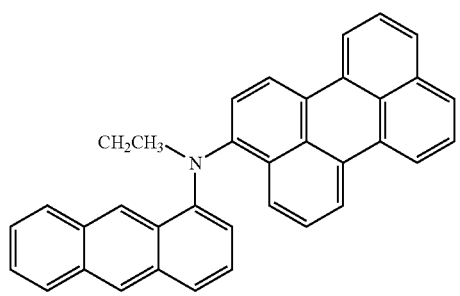
J-51
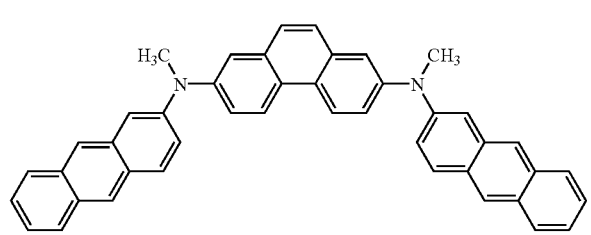
J-52
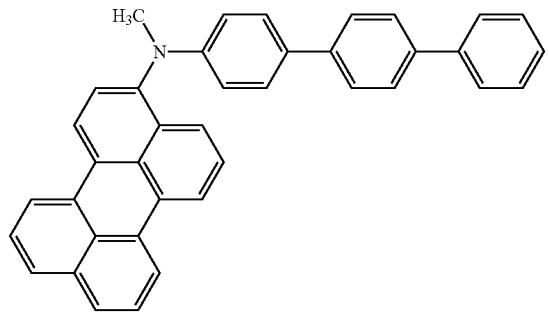
J-53
J-54
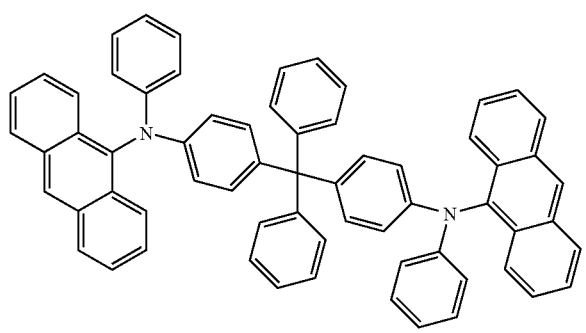

-continued
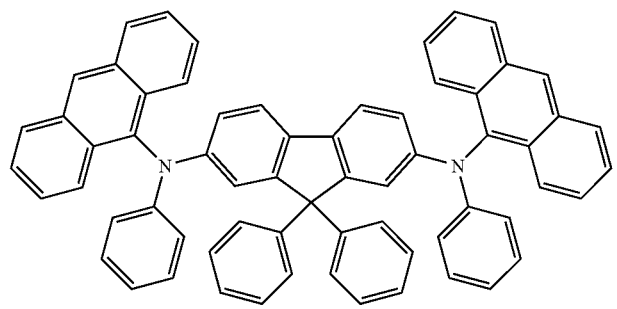
J-55
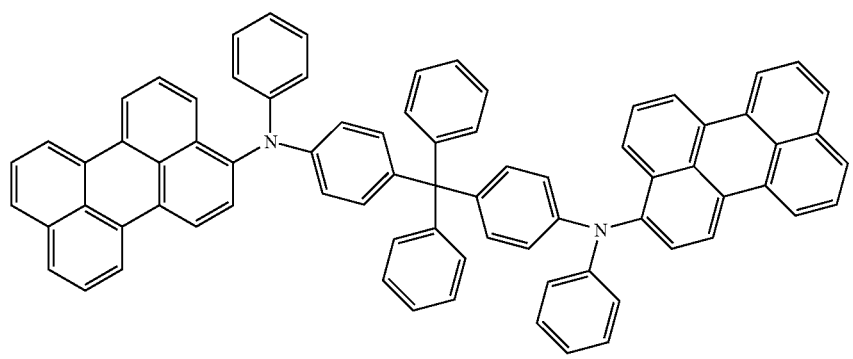
J-56
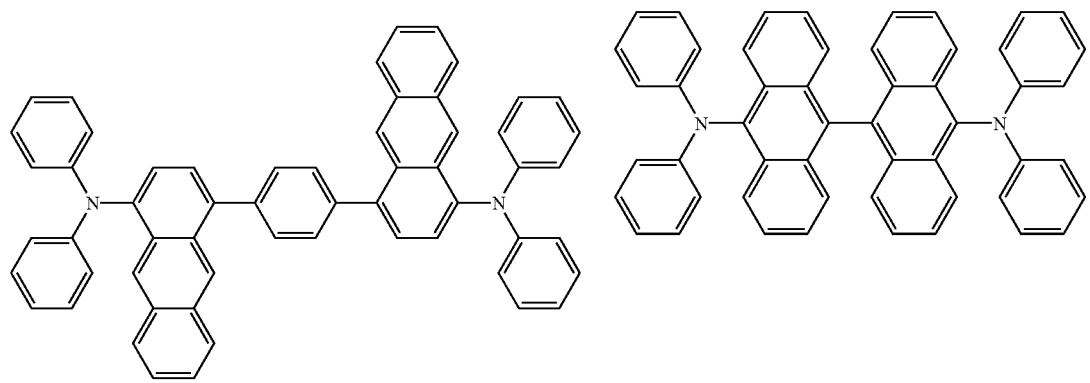
J-57
J-58
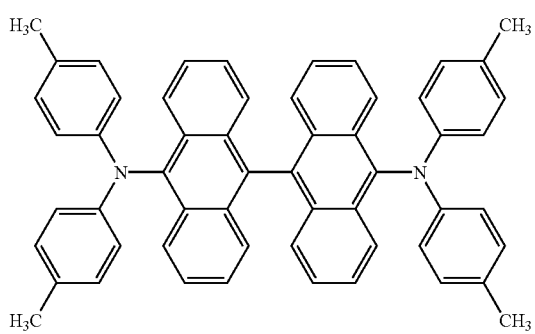
J-59
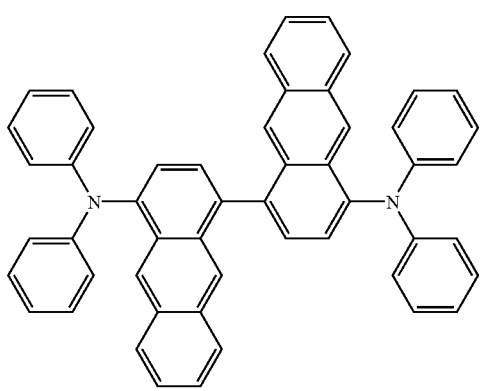
J-60

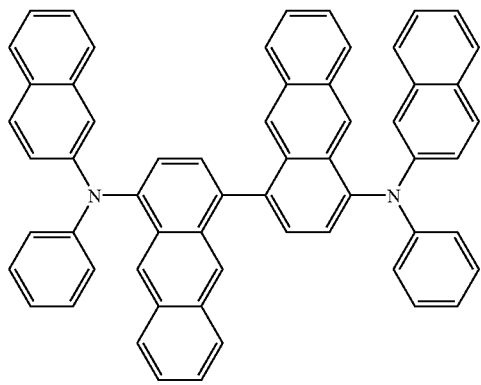

J-61

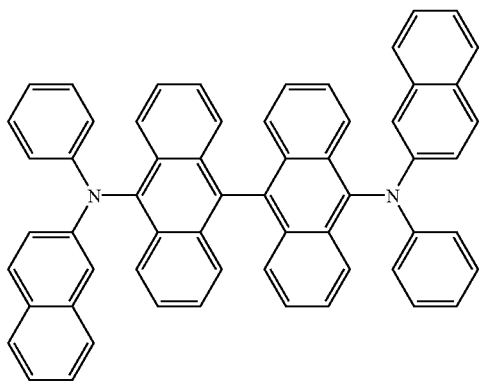

J-62

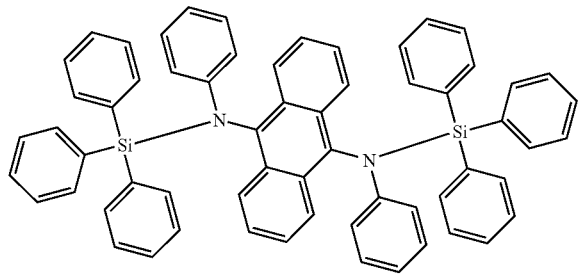

J-63

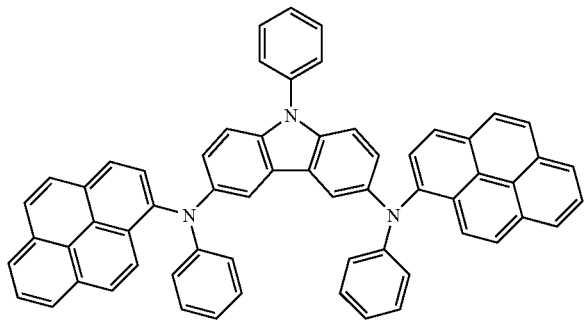

J-64

The second host used in the present invention can be a substituted or non-substituted quinoline derivative. Preferably, the second host is 8-hydroxyquinoline metal complex including the metal selected from the group consisting of Al, Zn, Mg, and Li, and more preferably, tris(8-quinolinolate) aluminum having the following structural formula.

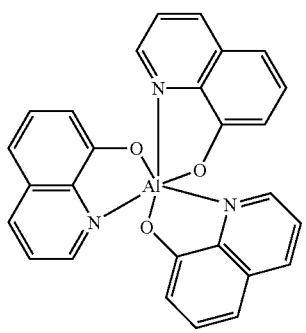

Moreover, a maximum PL luminescence peak of the guest of the present invention is equal to or greater than 550 nm. And, the guest is selected from the group consisting of DCM, Nile red, Coumarine, Rhodamine, pyrromethene, and benzothioxanphene derivatives.

Preferably, the DCM derivative has the following structural formula.

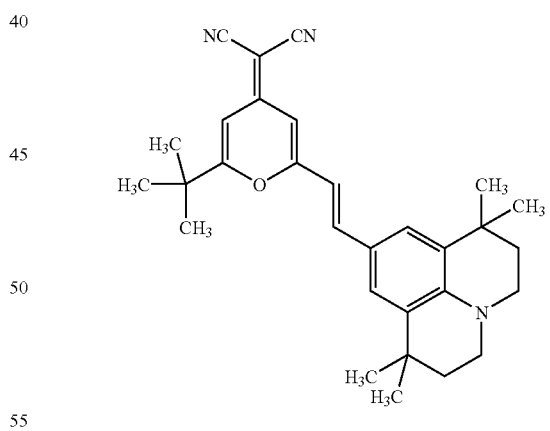

Figure 2A:
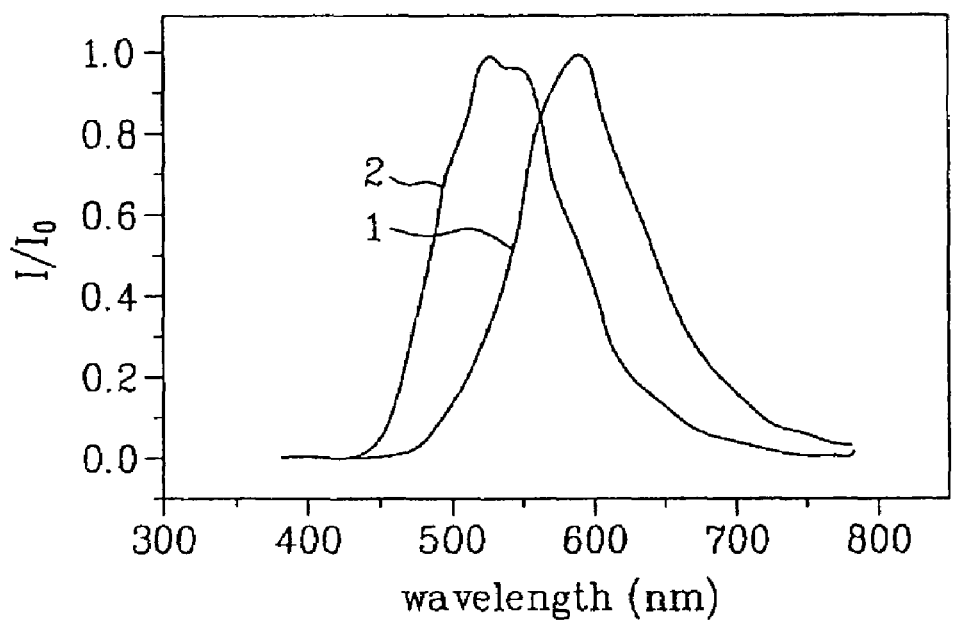
FIG. 2A illustrates a graph of an EL peak wavelength range of a device having a light-emitting layer including a first host only and an EL wavelength range of a device having a light-emitting layer including a second host only.
Figure 2B:
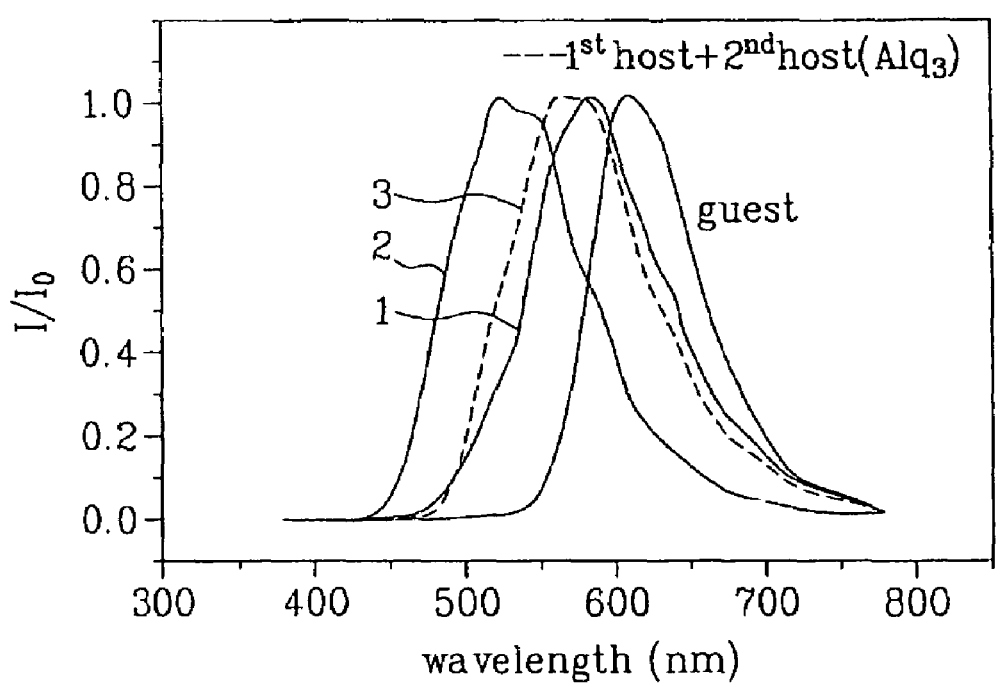
FIG. 2B illustrates a graph of an EL wavelength range of a device having a light-emitting layer including a mixture of first and second hosts.

FIG. 2A and FIG. 2B are graphs showing the characteristics of the present invention. FIG. 2A illustrates a graph of an EL peak 1 of a device {NPB (600 Å)/first host(200 Å)/Alq$_3$ (300 Å)/LiF/Al} having a light-emitting layer including a first host only and an EL peak 2 of a device {NPB(600 Å)/Alq$_3$ (200 Å)/Alq$_3$(300 Å)/LiF/Al} having a light-emitting layer including a second host only. And, a vertical axis in FIG. 2A indicates a normalized EL intensity.

And, FIG. 2B illustrates a graph of an EL peak 3 of a device {NPB(600 Å)/first host + Alq$_3$(200 Å)/Alq$_3$(300 Å)/LiF/Al} when first and second host materials are mixed with each other so as to be used for a light-emitting layer.

Referring to FIG. 2B, an EL peak of the device using first and second host materials together lies between the EL peak of the device using the first host material only and the other peak of the device using the second host only.

The EL (electroluminescent) peak value of the present invention, as shown in FIG. 2B, is between 520~600 nm so as to lie between the $Alq_3$ and first host.

Hereinafter, the present invention is explained in detail through the following synthesis examples for synthesis of host materials according to the present invention and embodiments exemplary for fabrication of an organic electroluminescent device using host materials according to the present invention. Yet, it will be apparent to those skilled in the art that various modifications and variations can be made in the present invention provided they come within the scope of the appended claims and their equivalents.

A. Host Material Synthesis According to the Present Invention

SYNTHESIS EXAMPLE 1

Synthesis of J-1 Compound

1) Synthesis of 3-bromoperylene

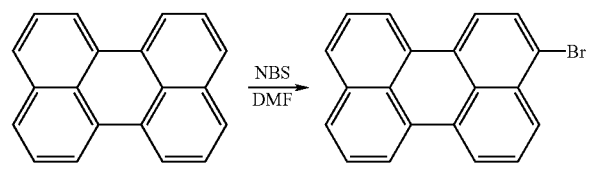

First of all, 2 g (0.008 mol) of perylene is dissolved in DMF (50 ml) out in 2-necks-r.b.f, and then 1.41 g of NBS (0.008 mol) dissolved in DMF (40 ml) is dropped in the 2-necks-r.b.f. slow at room temperature.

The solution is stirred for an hour, and then the reaction is terminated.

The reactant is added to methanol for precipitation, whereby precipitate is obtained. The precipitate is then filtered, whereby 2 g (75%) of 3-bromoperylene is extracted.

2) Synthesis of 3-(N,N-diphenylamino)-perylene

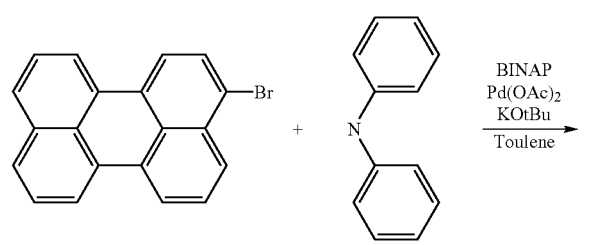

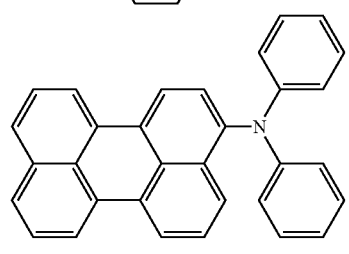

0.5 g (0.00151 mol) of 3-bromoperylene obtained in the above synthesis method 1), 0.51 g (0.003 mol) of diphenylamine, 0.233 g (0.0023 mol) of sodium ter-butoxide, 0.046 g of BINAP{2,2'-bis(diphenylphosphino)-1,1'-binaphthyl}, 0.016 g of Pd(II)acetate, and 50 ml of toluene are admitted into a 2-necks-r.b.f. so as to be refluxed for 24 hours.

Toluene is removed from the reaction solution by decompressed distillation. The reaction solution is washed with water, washed again with methanol, and filtered. And, recrystallization is carried out using THF/methanol.

Hence, 0.45 g (71%) of 3-(N,N-diphenylamino)-perylene is obtained.

SYNTHESIS EXAMPLE 2

Synthesis of J-5 Compound

1) Synthesis of (4-bromophenyl)-diphenyl-amine

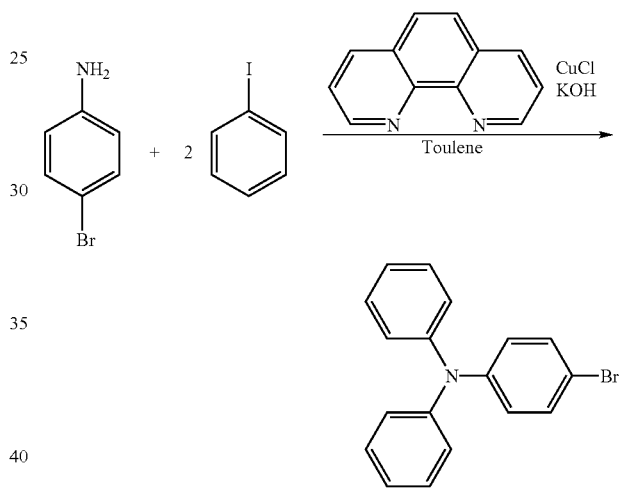

10 g (0.058 mol) of p-bromoaniline, 15 ml (0.133 mol) of iodinebenzene, 0.5 g of 1,10-phenanthroline, 0.32 g of CuCl, 25 g (0,464 mol) of KOH, and 100 ml of toluene are admitted into a 250 ml-3-necks-r.b.f. having a Dean-Stark trap installed thereat so as to be refluxed for 12 hours.

Toluene is removed from the reaction solution by decompressed distillation. The reaction solution is washed with water, and then recrystallized with methylene chloride/methanol, whereby 15.3 g (81%) of (4-bromopheny)diphenylamine is obtained.

2) Synthesis of 4-(diphenylamino)phenylboronic Acid

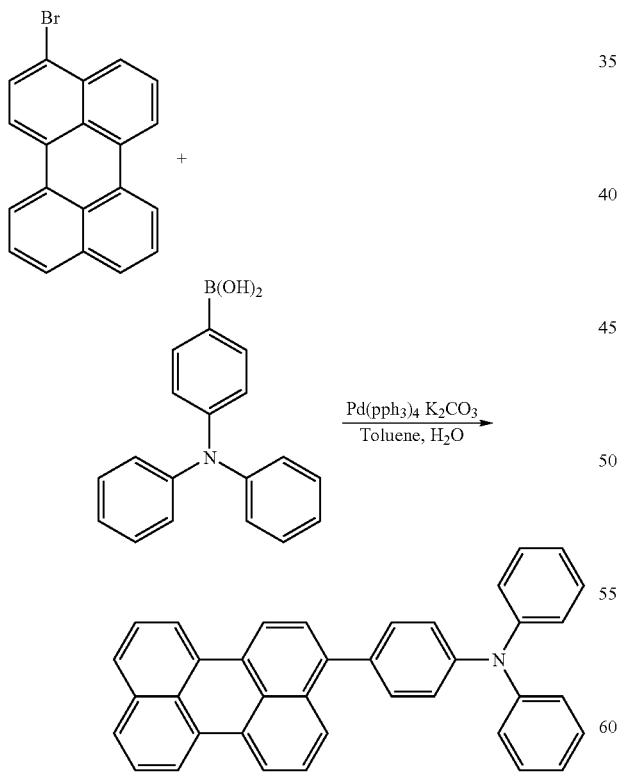

3.4 g (0.0105 mol) of (4-bromophenyl)-diphenyl-amine is admitted into a well-dried 3-necks-r.b.f. so as to be dissolved using 40 ml of dry diethylether.

Then, a bath of dry-ice (−78° C.) is installed, on which n-BuLi (1.6M, 9.84 ml, 0.0156 ml of hexane) is dropped slowly. A reaction temperature is increased to 0° C., the reaction is carried out for about 2 hours, a cooling is carried out using the bath of dry-ice (−78° C.), and then 2 ml (0.00178 mol) of trimethylborate is dropped thereon slowly.

Once the temperature is increased to room temperature, stirring is carried out for about 3 hours further.

1M of HCL is dropped on the stirred solution, and then extractions are carried out for 3 times using ether.

Decompressed distillation is carried out, washing is carried out using a small quantity of petroleum ether, and then filtering is carried out so as to obtain 1.51 g (60%) of compound.

3) Synthesis of 3-(4-diphenylamino-phenyl)perylene

First of all, 0.3 g (0.0009 mol) of 3-bromoperylene, 0.39 g (0.00135 mol) of 4-(diphenylamino)phenylboronic acid, 1 g (0.0020 mol) of K$_2$CO$_3$ are dissolved in 30 ml of toluene and 30 ml of H$_2$O.

Nitrogen gas is blown in for about 30 minutes, PD (pph$_3$)$_4$ amounting to 5 mol % of 3-bromoperylene) is added thereto, and then refluxing and stirring are carried out for 24 hours.

Water is removed therefrom, and washings are carried out 2-3 times using H$_2$O.

After toluene has been removed from the reaction solution by decompressed distillation, the reactant is dissolved in THF so as to obtain precipitate from methanol.

Hence, 0.29 g (63%) of compound is obtained. In the THF solvent, a PL peak $\lambda_{max}$ is 520 nm.

SYNTHESIS EXAMPLE 3

Synthesis of J-17 Compound

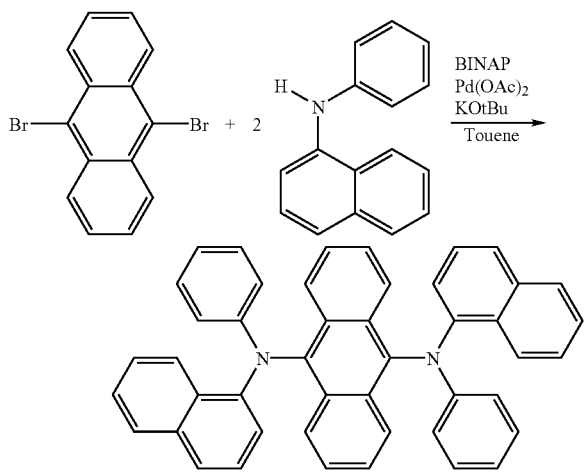

5 g (0.149 mol) of 9,10-dibrmoanthracene, 9.8 g (0.0447 mol) of N-phenyl-1-naphthylamine, 5.37 g (0.052 mol) of tert-butoxide, 0.46 g of BINAO, and 0.1 g of Pd (II) acetate are admitted into a 1-neck-r.b.f., and 130 ml of toluene is added thereto. And, the solution is refluxed so as to be stirred for 30 hours.

Toluene is removed by decompressed distillation, and the toluene-free reaction solution is washed twice.

Recrystallization is carried out thereon using THF and methanol.

Hence, 3.6 g (40%) of compound is obtained.

In the THE solvent, a PL peak $\lambda_{max}$ is 520 nm.

SYNTHESIS EXAMPLE 4

Synthesis of J-33 Compound

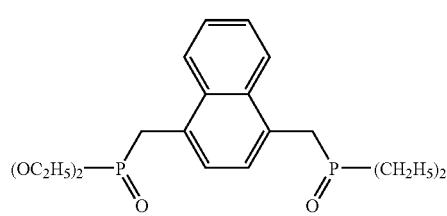

-continued

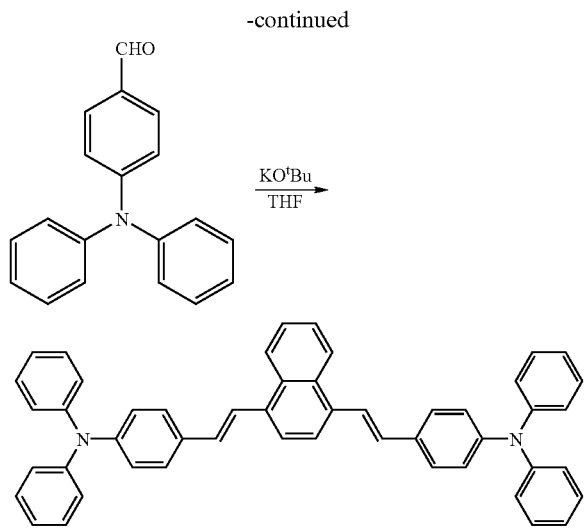

1.5 g (0.0035 mol) of naphthylphosphate and 2.4 g (0.0088 mol) of 4-diphenylaminobenzoaldehyde, which are admitted into a 2-necks-r.b.f., are dissolved in 80 ml of THE. 1.96 g (0.018 mol) of KO'Bu are then added to the reaction solution so as to be stirred for 24 hours at room temperature.

After reaction, methanol is added thereto so as to obtain precipitate. And, the precipitate is filtered, whereby 1.26 g (80%) of compound is obtained.

B. Fabrication of Organic Electroluminescent Device

FIRST EMBODIMENT

In the first embodiment of the present invention, two species of host materials are deposited on an organic light-emitting layer together with a red luminescent material for the fabrication of the organic EL device.

First of all, an ITO glass is patterned so as to have a size of 3 mm×3 mm. The patterned ITO glass is then cleaned.

A substrate is loaded on a vacuum chamber of which basic pressure is set up as $1 \times 10^{-6}$ torr, CuPC (60 Å), NPB (350 Å), a light-emitting layer (first host:second host:red luminescent material) (200 Å), $Alq_3$ (500 Å), LiF (5 Å), and Al (1,000 Å) are deposited successively on the ITO.

J-5 compound, $Alq_3$, and dcjtb are used as the first host, second host, and red luminescent material of the light-emitting layer, respectively. In this case, a mixture ratio between the first host, second host, and red luminescent material is 1:1:0.02.

As a result of experiment, brightness shows 612 cd/m² (9.4V) at 1 mA, whereby CIE x=0.610, y=0.382.

SECOND EMBODIMENT

The second embodiment of the present invention is carried out by the same method of the first embodiment of the present invention except that J-17 compound is used.

As a result of experiment, brightness shows 700 cd/m² (9.8V) at 1 mA, whereby CIE x=0.605, y=0.384.

COMPARATIVE EXAMPLE

First of all, an ITO glass is patterned so as to have a size of 3 mm×3 mm. The patterned ITO glass is then cleaned. A substrate is loaded on a vacuum chamber of which basic pressure is set up as $1'10^{-6}$ torr, CuPC (60 Å), NPB (350 Å), a light-emitting layer (200 Å), $Alq_3$ (500 Å), LiF (5 Å), and Al (1,000 Å) are deposited successively on the ITO. In this case, the light-emitting layer includes $Alq_3$ and a red luminescent material only, and a mixture ratio thereof is 1:0.01.

As a result of experiment, brightness shows 500 cd/m² (10.0V) at 1 mA, whereby CIE x=0.607, y=0.386.

As explained in the above description, the organic electroluminescent device according to the present invention transfers energy efficiently using the red luminescent material, thereby enabling to enhance a red luminescence efficiency.

Accordingly, the present invention uses such a light-emitting layer, thereby enabling to realize a red luminescent device having a high efficiency despite a low driving voltage.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. An organic electroluminescent device comprising:
a first electrode;
a second electrode; and
a light-emitting layer having a guest material of a red luminescent material and first and second host materials formed between the first and second electrodes;
wherein the first host material is an aromatic compound having one of the following structural formula;

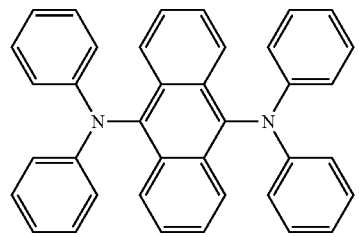

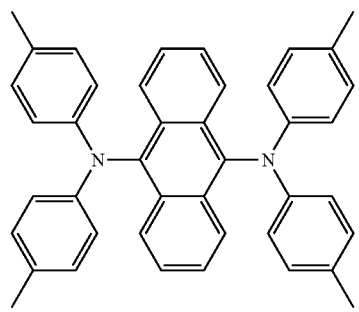

-continued

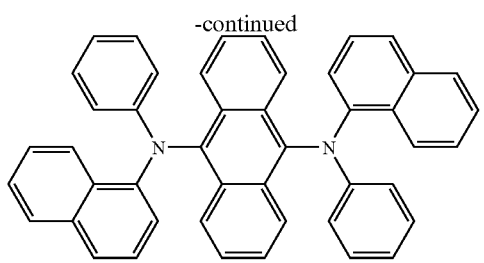

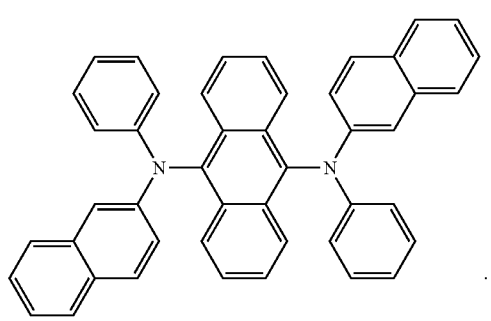

the second host material is a compound Alq₃ which has the following structural formula;

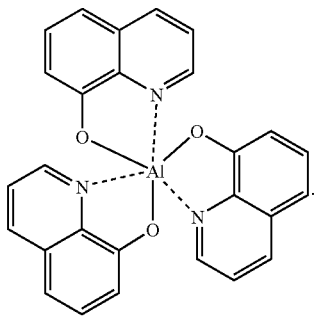

and the guest material is a DCM Derivative which has the following structural formula;

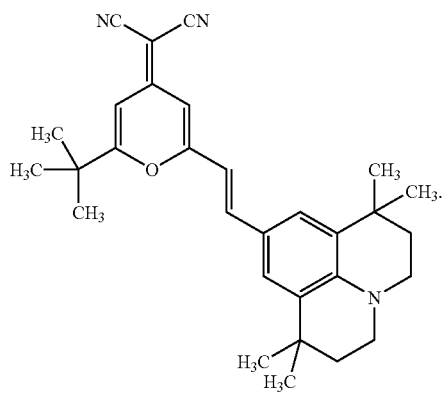

wherein the light emitting layer with the guest material and the first and second host materials enhances red luminescence efficiency of the device and has similar CIE coordinates of a red color in comparison with a red light emitting layer comprising the second host material alone with the guest material, wherein the first host material alone has a first PL peak value at a first wavelength, the second host material alone has a second PL luminescent peak value at a second wavelength, and the first and second host materials together have a third PL peak value at a third wavelength band between the first and second wavelengths.

2. The organic electroluminescent device of claim 1, wherein an electron injection/transport layer is formed between the second electrode and light-emitting layer.

3. The organic electroluminescent device of claim 1, wherein the light-emitting layer has a composition of 0.01~30 wt. % of the guest material, 0.05~99.9 wt. % of the first host material and the second host material.

4. The organic electroluminescent device of claim 1, wherein a maximum PL luminescence peak of the guest material is equal to or greater than 550 nm.

* * * * *